United States Patent
Kato et al.

[11] Patent Number: 5,952,157
[45] Date of Patent: Sep. 14, 1999

[54] METHOD FOR REMOVAL OF RESIST FILM AND METHOD FOR PRODUCTION OF SEMICONDUCTOR DEVICE

[75] Inventors: Toshio Kato; Noboru Tokumasu, both of Tokyo, Japan

[73] Assignees: Canon Sales Co., Inc.; Semiconductor Process Laboratory Co.,, both of Japan

[21] Appl. No.: 08/928,491

[22] Filed: Sep. 12, 1997

[30] Foreign Application Priority Data

Jun. 24, 1997 [JP] Japan .................................. 9-167038

[51] Int. Cl.⁶ ........................................................ G03F 7/42
[52] U.S. Cl. .............................................. 430/329; 134/1.3
[58] Field of Search ...................................... 430/311, 329; 134/1, 1.3, 42

[56] References Cited

U.S. PATENT DOCUMENTS 4,430,182  2/1984  Hishida ............................... 204/192 P
4,544,416  10/1985  Meador ................................... 148/1.5

FOREIGN PATENT DOCUMENTS 367074  5/1990  European Pat. Off. ............... 430/329

Primary Examiner—Kathleen Duda
Attorney, Agent, or Firm—Lorusso & Loud

[57] ABSTRACT

This invention concerns a method for the removal of a resist film containing phosphorus (P) or boron (B) or other inorganic element. Specifically, a resist film 42 formed on a substrate 41 is exposed to the liquid or gas of chlorosulfonic acid [$SO_2Cl(OH)$] and caused to react with the acid and, consequently, is enabled to be removed from the substrate 41.

13 Claims, 6 Drawing Sheets

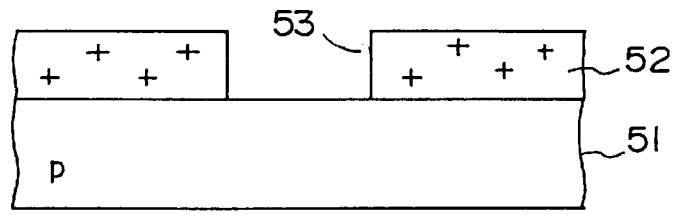
Fig.5A
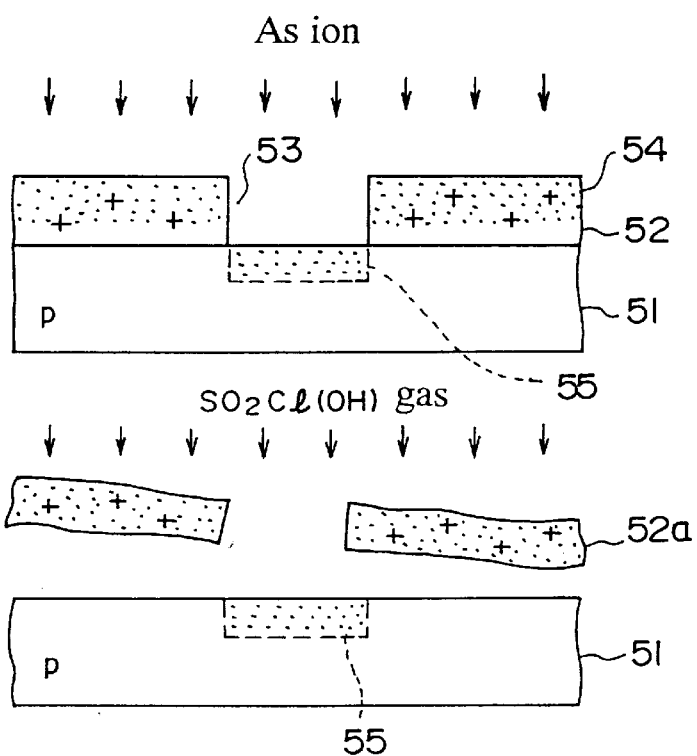
Fig.5B
Fig.5C
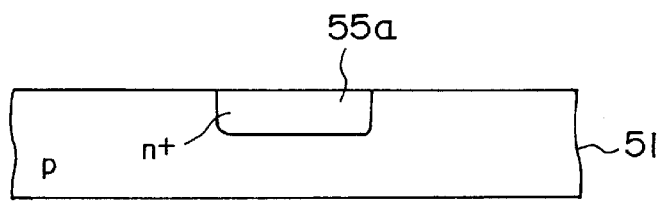
Fig.5D 5,952,157

METHOD FOR REMOVAL OF RESIST FILM AND METHOD FOR PRODUCTION OF SEMICONDUCTOR DEVICE

BACKGROUND OF THE INVENTION

1. Field of the Invention

This invention relates to a method for the removal of a resist film and a method for the production of a semiconductor device and more particularly to a method for the removal of a resist film containing arsenic (As), phosphorus (P) or boron (B), and other inorganic elements and a method for the production of a semiconductor device.

2. Description of the Prior Art

In recent years, methods for the production of semiconductor devices have extensively used a photoresist film as the mask for ion injection or as the mask for dry etching (referred to briefly as "resist film" hereinafter).

By the time that the resist film has been used in production, inorganic elements including arsenic (As), phosphorus (P), or boron (B) which is used for ion injection and aluminum (Al) or titanium (Ti), which is an electrode material to be patterned, have become mingled with the resist film and suffered to form complicated compounds with the material of the resist film which ultimately solidify. The resist film of this nature cannot be easily removed by the well-known method for removing a resist film by the use of an oxygen plasma or ozone and, therefore, there is no alternative but to rely on a complicated treatment.

A method for removing a resist film by the use of sulfuric anhydride ($SO_3$) has been proposed and has been attracting keen attention recently.

FIG. 9 is a diagram illustrating the construction of a convenient apparatus which can be adopted for the removal of a resist film by the use of sulfuric anhydride ($SO_3$).

As illustrated in FIG. 9, a $SO_3$ solution is dropped from a feeder 2 into a flask 1 and is gasified in the flask 1 by heating. The formed $SO_3$ gas is led into a separate vessel 7 and caused to react with a resist film on a substrate 12 which is heated or kept at room temperature with a heater 11. The $SO_3$ gas used in the vessel 7 is led into a separate vessel 14 and dissolved in sulfuric acid 17 therein.

When the method mentioned above was tried with samples having resist films, some containing inorganic elements and others not containing any inorganic element, deposited each on the substrate 12, the resist films containing no inorganic element could be easily removed and, more often than not, the resist films containing the inorganic elements could not be easily removed.

SUMMARY OF THE INVENTION

It is an object of this invention to provide a method for the removal of a resist film, which enables a resist film having incorporated therein such inorganic elements as arsenic (As) to be easily removed.

This invention exposes the resist film to chlorosulfonic acid [$SO_2Cl(OH)$] in a liquid state or a gaseous state.

In an experiment using the chlorosulfonic acid [$SO_2Cl(OH)$] in a liquid state, the resist film could be easily removed from the substrate even when the liquid temperature was not lower than 70° C. and the resist film had incorporated therein any of As, P, and B as shown in Table 1.

In an experiment using the chlorosulfonic acid [$SO_2Cl(OH)$] in a gaseous state, the resist film could be easily removed from the substrate even when the substrate temperature was not higher than 60° C. and the resist film had incorporated therein any of As, P, and B as shown in Table 2.

In Table 1 and Table 2, the mark Δ denotes the state in which the resist remained unseparated in a proportion of 1—several % of the total wafer area.

The effect mentioned above can be attained when the resist film formed on the substrate is exposed to a gas containing sulfuric anhydride and hydrochloric acid or a gas containing hydrochloric acid and allowed to react with the gas and the resist film is then removed from the substrate.

BRIEF DESCRIPTION OF THE DRAWING

FIGS. 5A–5D are cross sections illustrating a method for the production of a semiconductor device according to the eighth embodiment of this invention.

DESCRIPTION OF THE PREFERRED EMBODIMENT

Now, preferred embodiments of this invention will be described below with reference to the accompanying drawings.

(1) First through fourth embodiments

Figure 1:
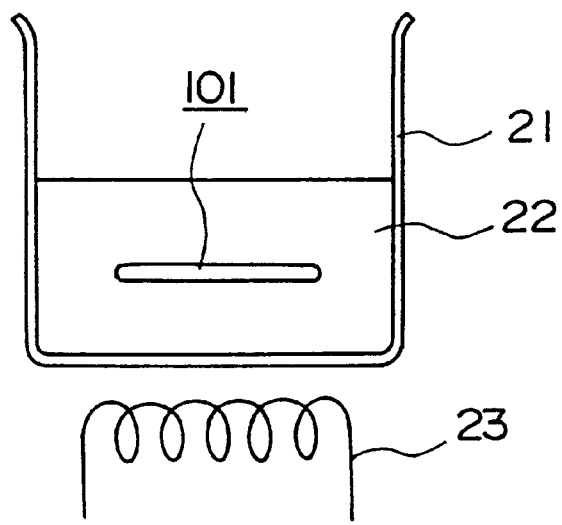
FIG. 1 is a side view illustrating an apparatus to be used in methods for the removal of a resist film according to the first through the fourth embodiments of this invention.

FIG. 1 is a cross section illustrating the construction of an apparatus to be used in a method for the removal of a resist film according to an embodiment of this invention.

As illustrated in FIG. 1, chlorosulfonic acid [$SO_2Cl(OH)$] in a liquid state is placed in a beaker 21 and heated to a prescribed temperature with a heater 23. A sample 101 is immersed in the chlorosulfonic acid kept at the prescribed temperature.

Then, the apparatus of FIG. 1 was used in an experiment for removing under varying treating conditions such resist films as were produced under varying manufacturing conditions. The results of the experiment will be described below.

Figure 3A:
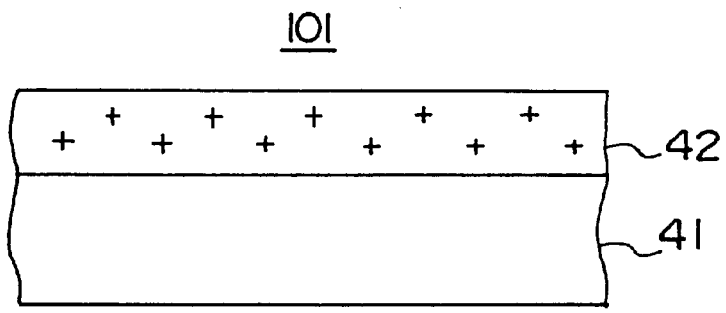
FIGS. 3A–3C are cross sections illustrating methods for the removal of a resist film according to the first through the seventh embodiments of this invention.
Figure 3B:
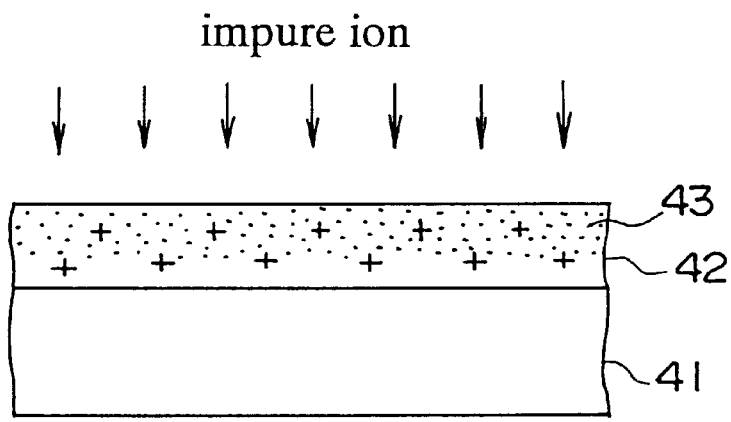
Figure 3C:
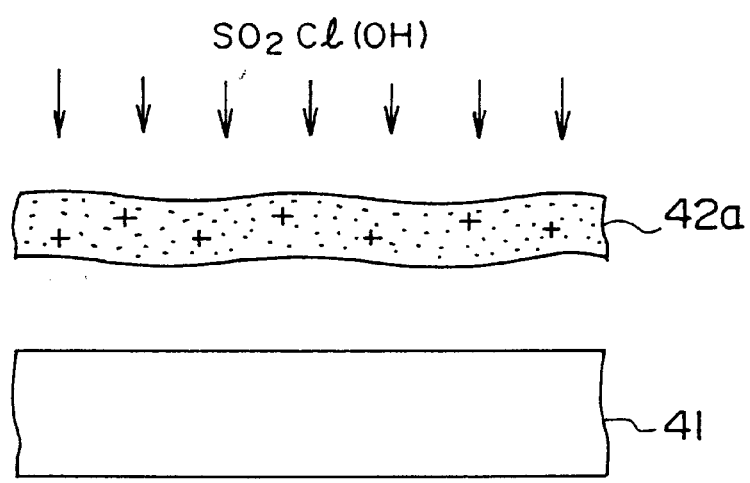

As the sample 101, what was obtained by forming a resist film 42 on a silicon substrate (substrate under treatment) 41 as illustrated in FIG. 3A was used. A positive type i ray photoresist was used as the material for the resist film 42.

(Formation of resist film)

Four different resist films 42 were formed on the silicon substrate 41 i.e. three resist films having As, P, and B severally ion injected therein and one resist film having none of these inorganic elements ion injected therein.

The As was ion injected under the conditions, $2\times10^{15}$ $cm^{-2}$ in dosage and 50 keV in acceleration voltage.

The P was ion injected under the conditions, $2\times10^{15}$ $cm^{-2}$ in dosage and 50 keV in acceleration voltage.

The B was ion injected under the conditions, $2\times10^{15}$ $cm^{-2}$ in dosage and 50 keV in acceleration voltage.

(First embodiment)

In a beaker 21, about 100 cc of chlorosulfonic acid in the liquid state was placed and kept at room temperature (23° C.) and the semiconductor substrate 101 having a resist film formed thereon was immersed in the liquid chlorosulfonic acid for five minutes. The substrate 101 was then pulled out of the liquid, washed with water, and dried.

The results show that the resist film containing no inorganic element, immediately after immersion in the liquid chlorosulfonic acid, began to dissolve into the acid and the acid turned to a light brown color. When the substrate was washed with water, dried, and visually examined, it was found to be completely devoid of the resist film. It was found that the resist film was removed, not because it had been thoroughly dissolved in the liquid chlorosulfonic acid but because it had been partly dissolved therein and the resist film which survived the solution had peeled from the silicon substrate 41.

The resist films having As and B ion injected therein were removed, though incompletely.

In contrast, the resist film having P ion injected therein peeled only in a small part and remained unaltered in most part.

(Second embodiment)

This embodiment was different from the first embodiment in that the temperature of the liquid chlorosulfonic acid was kept in the range of 40–45° C.

The results for the four different of samples were substantially the same as those obtained in the first embodiment.

(Third embodiment)

This embodiment was different from the first embodiment in that the temperature of the liquid chlorosulfonic acid was kept at 70° C.

The results show that the resist films having As and B severally ion injected therein were removed more thoroughly than those in the first and second embodiments.

The resist film having P ion injected therein in the present embodiment was likewise removed, though incompletely, unlike those of the first and second embodiments.

(Fourth embodiment)

This embodiment was from the first embodiment in that the temperature of the liquid chlorosulfonic acid was kept at 100° C.

The results show that the resist film containing no inorganic element and the resist films having As, P, and B severally ion injected therein were invariably removed with full thoroughness. The surface gloss of the silicon substrate 41, however, was observed to cloud more or less after the formation of a resist film as compared with that existent before the formation of the resist film.

The test results obtained in the first through the fourth embodiments mentioned above are collectively shown in Table 1.

TABLE 1

| treating conditions | | resist (doping element) | | | |
|---|---|---|---|---|---|
| liquid temp. | time | non | As | B | P |
| room temp. | 5 min | ○ | Δ | ○~Δ | X |
| 40~45° C. | 5 min | ○ | Δ~Δ | ○~Δ | X |
| 70° C. | 5 min | ○ | ○ | ○ | Δ |
| 100° C. | 5 min | ○ | ○ | ○ | ○ |

(SO$_2$Cl(OH) liquid)

It is clearly noted from Table 1 that in the first through the fourth embodiments, when chlorosulfonic acid was used in a liquid state and even when the liquid chlorosulfonic acid was kept at room temperature, the resist film having undergone no ion injection and the resist films having As and B severally ion injected therein were thoroughly and invariably removed while the resist film having P ion injected therein was not removed.

When the temperature of the liquid chlorosulfonic acid was elevated to a level above 70° C., even the resist film having P ion injected therein was thoroughly removed.

(2) Fifth through seventh embodiments

Figure 2:
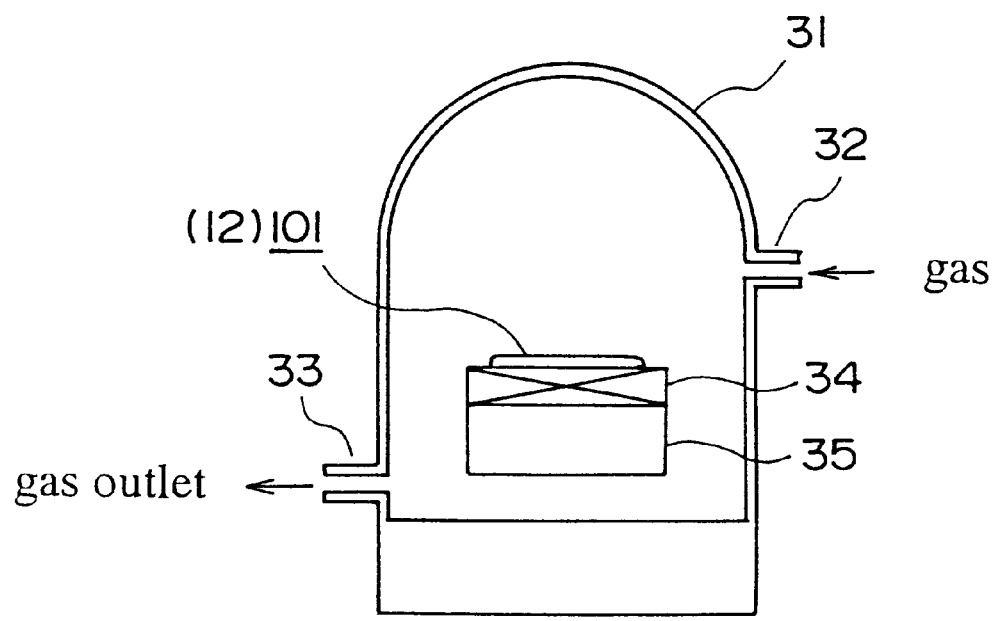
FIG. 2 is a side view illustrating an apparatus to be used in methods for the removal of a resist film according to the fifth through the seventh embodiments of this invention.

FIG. 2 is a cross section illustrating the construction of an apparatus to be used in a method for the removal of a resist film according to an embodiment of this invention.

As illustrated in FIG. 2, a sample 101 is mounted on a loading base 35 provided with a built-in heater 34. The temperature of the sample 101 is adjusted by the heater 34. When the sample 101 is kept at room temperature, no heating is carried out. The chlorosulfonic acid [SO$_2$Cl(OH)] in the gaseous state is introduced through a gas inlet 32 into a chamber 31 by using nitrogen gas as a carrier gas. The chlorosulfonic acid which has been used is discharged from the chamber 31 via a gas outlet 33.

The resist films produced under varying manufacturing conditions by the use of the apparatus of FIG. 2 were removed under varying conditions. The results will be described below with reference to the fifth through the seventh embodiments.

Sample 101 was the product obtained by forming the resist film 42 on the silicon substrate 41 as illustrated in FIG. 3A. Four different resist films were manufactured in, i.e. three resist films having As, P, and B severally ion injected therein and one resist film having none of these inorganic elements ion injected therein. The conditions for the manufacture of these resist films were the same as those in the first embodiment.

(Fifth embodiment)

The sample 101 having a resist film formed thereon was placed in the chamber 31 and, with the temperature of the substrate kept therein at room temperature (23° C.), the chlorosulfonic acid in the gaseous state was introduced into the chamber 31 and then retained therein for 30 minutes.

The results show that the resist films having As, P, and B severally ion injected therein as well as the resist film containing no inorganic element were thoroughly and invariably removed. The surface of the silicon substrate 41 had a perfect specular gloss and, when observed under a scanning electron microscope, showed absolutely no residue of resist.

The resist films having the inorganic elements severally ion injected therein were removed as thoroughly on exposure to the gaseous chlorosulfonic acid as when they were immersed in the liquid chlorosulfonic acid. It was found that the resist films were removed, not because they had been thoroughly dissolved by the gaseous chlorosulfonic acid but because they had been partly dissolved therewith and the resist films which survived the solution had peeled from the silicon substrate 41.

(Sixth embodiment)

This embodiment is different from the fifth embodiment in that the temperature of the substrate was kept at 60° C.

The results show that when the resist film containing no inorganic element was treated with the gas, then washed with water, and dried, it was visually confirmed to have been thoroughly removed.

The resist films having As, P, and B severally ion injected therein were removed, though imperfectly.

(Seventh embodiment)

This embodiment differed from the fifth embodiment in that the temperature of the substrate was kept at 160° C.

The results show that the resist film containing no inorganic element was thoroughly removed.

In contrast, the resist films having As, P, and B severally ion injected therein were not removed at all.

The results obtained in the fifth through the seventh embodiments are collectively shown in Table 2.

TABLE 2

| treating conditions | | resist (doping element) | | | |
|---|---|---|---|---|---|
| substrate temp. | time | non | As | B | P |
| room temp. | 30 min | ○ | ○ | ○ | ○ |
| 60° C. | 30 min | ○ | Δ | Δ | Δ |
| 160° C. | 7 min | ○ | X | X | X |

$SO_2Cl(OH)$ gas

It is clearly noted from the results shown in Table 2 that the ease with which the resist film was removed increased in proportion as the wafer temperature lowered when the chlorosulfonic acid was used in the gaseous state and that the resist film having undergone no ion injection and the resist films having As, P, and B severally ion injected were removed thoroughly when the wafer temperature was not higher than 60° C. Since this embodiment uses the chlorosulfonic acid in the gaseous state, it allows the acid to be handled with ease and permits the etchant used for the removal of the resist film to be controlled easily by the adjustment of the flow volume of the gas. Further, this embodiment enables a multiplicity of substrates to be treated all at once and contributes to improvement in the efficiency of quantity production of the semiconductor devices.

Figure 6:
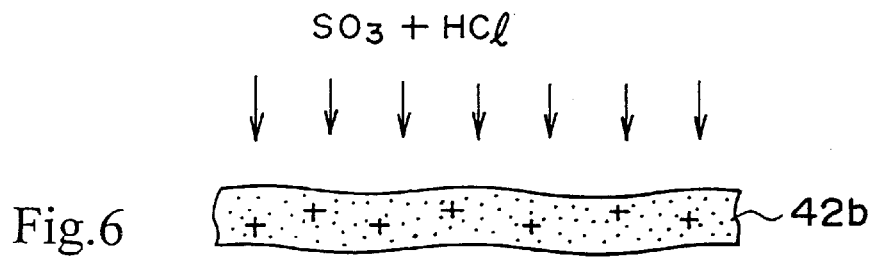
FIG. 6 is a cross section illustrating a method for the removal of a resist film according to another embodiment of this invention.

While the embodiments mentioned above have been depicted as using chlorosulfonic acid in the gaseous state, the gas of sulfuric anhydride and the gas of hydrochloric acid may be fed together mixed in a proper ratio as illustrated in FIG. 6. Likewise in this case, the same effect is obtained as when the gaseous chlorosulfonic acid alone was used. This gaseous hydrochloric acid may be secured from a commercially available cylinder packed with a gaseous hydrochloric acid or may be formed by a suitable method. In FIG. 6, 41 represents a silicon substrate and 42b represents a resist film containing no inorganic element or a resist film containing an inorganic element.

Figure 7:
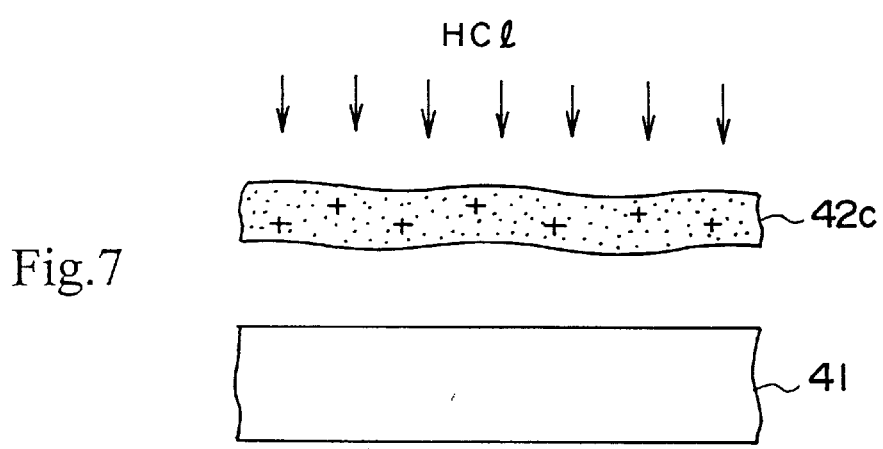
FIG. 7 is a cross section illustrating a method for the removal of a resist film according to yet another embodiment of this invention.

It has been found that the use of gaseous hydrochloric acid alone as illustrated in FIG. 7 is effective in the removal of not only a resist film containing no inorganic element but also resist films containing inorganic elements. In FIG. 6, 41 represents a silicon substrate and 42c represents a resist film containing no inorganic element or a resist film containing an inorganic element.

Figure 8:
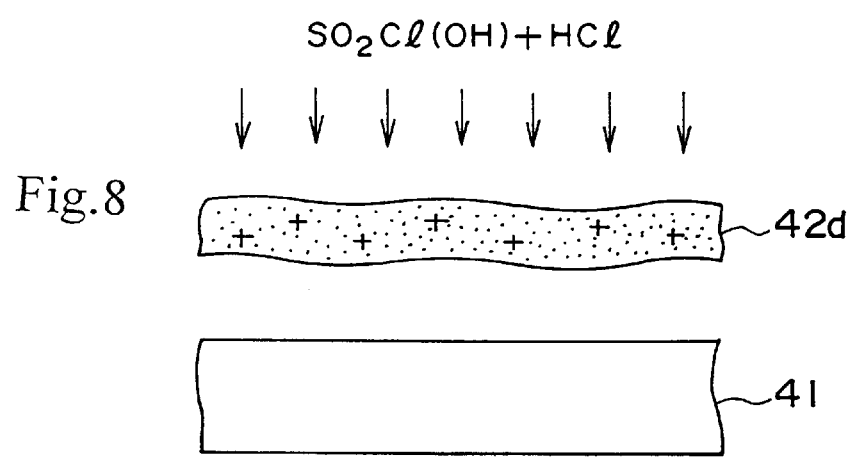
FIG. 8 is a cross section illustrating a method for the removal of a resist film according to still another embodiment of this invention.

There are times when the gas of chlorosulfonic acid may incorporate therein the gas of hydrochloric acid as illustrated in FIG. 8. In FIG. 8, 42 represents a silicon substrate and 42d represents a resist film containing no inorganic element or a resist film containing an inorganic element.

(3) First–fourth comparative examples

Figure 9:
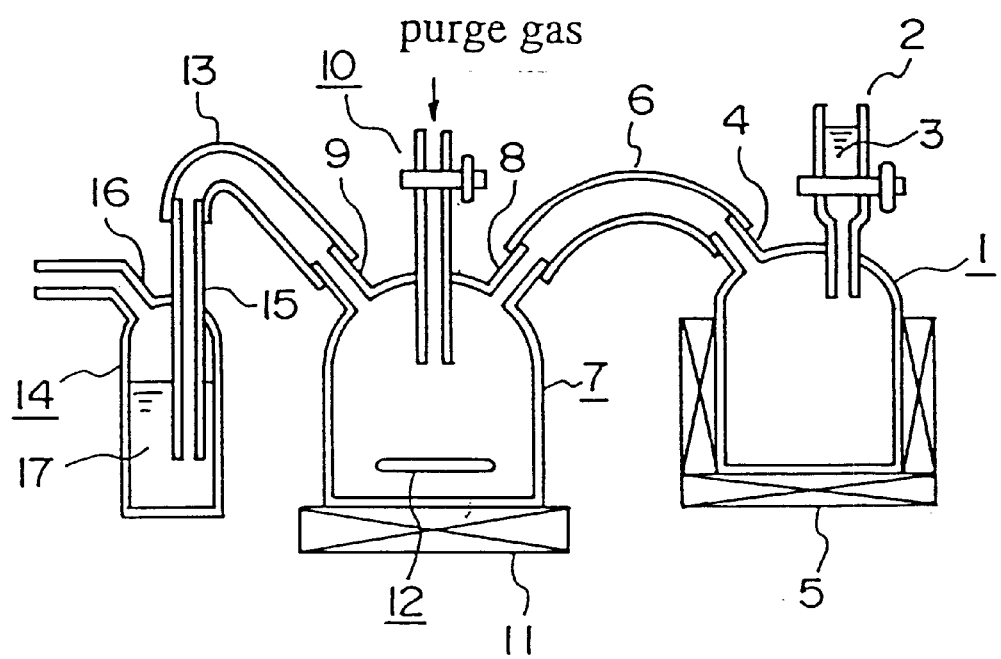
FIG. 9 is a side view illustrating an apparatus to be used in a method for the removal of a resist film according to a comparative example.

FIG. 9 is a diagram illustrating a convenient apparatus capable of being used in the removal of a resist film by the use of sulfuric anhydride (sulfonic acid, $SO_3$).

As illustrated in FIG. 9, a $SO_3$ solution 3 is dropped from a feeder 2 into a flask 1 and gasified therein by being heated with a heater 5 The formed $SO_3$ gas is passed through a pipe 6 via an outlet 4 and led to an inlet 8 to a separate vessel 7, and introduced into the vessel 7. Inside the vessel 7, the sample 12 is placed as heated, with the heater or not heated but is retained at room temperature, with the result that the introduced $SO_3$ gas will react with the resist film of the sample 12. The $SO_3$ gas used in the vessel 7 is passed through a pipe 13 via an outlet 9 by the purge gas introduced through a purge gas inlet 10, then led to a gas inlet 15 to another vessel 14, and dissolved in sulfuric acid 17 containing in the vessel 14.

The resist film of the sample 12 was manufactured as two kinds, i.e. a resist film having As ion injected therein and a resist film containing no inorganic element.

(First comparative example)

The sample 12 in the vessel 7 was kept at room temperature and exposed to the gas of sulfonic acid for two minutes.

The results show that the resist film containing no inorganic element was thoroughly removed.

In contrast, the resist film having As ion injected therein was found to change color in about 20 seconds after the start of the exposure of the film to the gas of sulfonic acid. After the vessel 7 was thoroughly emptied of the gas of sulfonic acid, the sample was extracted from the vessel, washed with water, and visually examined. The resist film was not removed at all.

(Second comparative example)

This comparative example differed from the first comparative example in that the temperature of the sample 12 was several tens of degrees in Centigrade and the duration of the exposure to the gas was 15 minutes.

The results show that the resist film containing no inorganic element and the resist film having As ion injected therein produced nearly same results as those in the first comparative example.

(Third comparative example)

This comparative example differed from the first comparative example in that the apparatus of FIG. 2 was used instead, the temperature of the sample 12 was kept at a level in the range of 140–171° C., and the duration of exposure of the sample to the gas was 7 minutes. In this case, the resist film having As ion injected therein was used alone as the resist film.

The results shown that the resist film was not removed at all.

(Fourth comparative example)

This comparative example differed from the first comparative example in that the apparatus of FIG. 2 was used instead, the temperature of the sample 101 was kept at a level in the range of 223–241° C., and the duration of the exposure of the sample to the gas was 12 minutes. Again in this case, a resist film having As ion injected therein alone was used as the resist film.

The results show that the resist film was not removed at all, similar to the third comparative example.

TABLE 3

| | | SO$_3$ gas | |
|---|---|---|---|
| treating conditions | | resist (doping element) | |
| substrate temp. | time | non | As |
| room temp. | 2 min | ○ | X |
| several tens of degrees | 15 min | ○~Δ | X |
| 140~171° C. | 7 min | — | X |
| 223~241° C. | 12 min | — | X |

As described with reference to the first through the seventh embodiments and the first through the fourth comparative examples above, the resist films containing inorganic elements which were not removed with sulfonic acid (SO$_3$) were thoroughly removed with chlorosulfonic acid [SO$_2$Cl(OH)] in the liquid state or gaseous state. Temperatures exceeding 70° C. proved advantageous when the chlorosulfonic acid [SO$_2$Cl(OH)] was in the liquid state and temperatures not exceeding 60° C. proved advantageous when the chlorosulfonic acid [SO$_2$Cl(OH)] was in the gaseous state.

(Eighth embodiment)

Now, a method for the manufacture of a semiconductor device by the use of the method for the removal of resist film mentioned above will be briefly described with reference to FIGS. 5A–5D.

Figure 4:
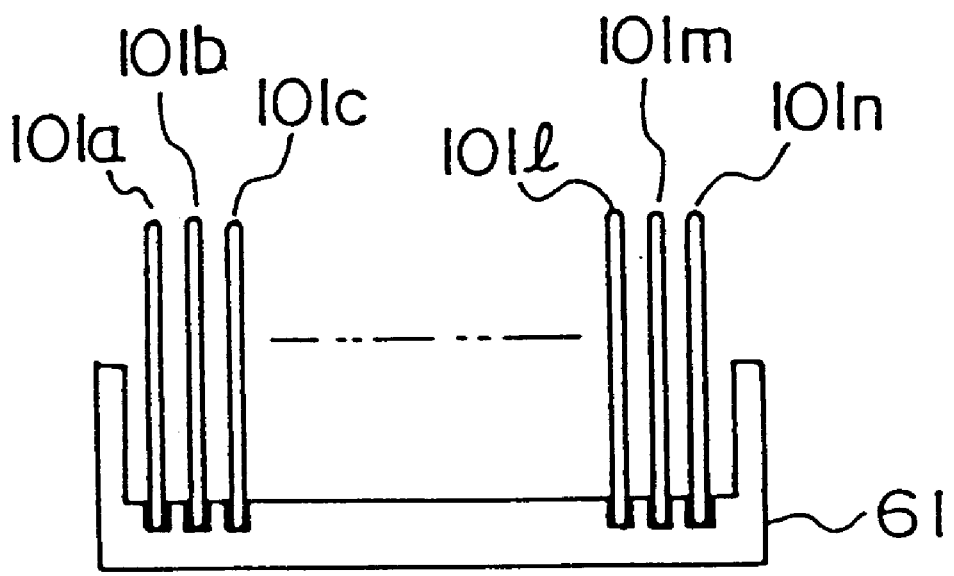
FIG. 4 is a cross section illustrating a substrate retaining tool to be used in a method for the production of a semiconductor device according to an embodiment of this invention.

In this case, the apparatus illustrated in FIG. 2 is used and a substrate retainer 61 made of quartz and constructed as illustrated in FIG. 4 is adopted. Since the substrate retainer 61 is capable of mounting a multiplicity of wafers, it is enabled to give the necessary treatment to numerous wafers.

First, a resist is applied by the rotary coating method on a silicon substrate 51 and the applied layer of the resist is thermally hardened to form a resist film 52. Then, an opening 53 is formed in the resist film 52 in the area through which a given element is ion injected into the silicon substrate 51. The outcome of this process is shown in FIG. 5A.

Next, As is ion injected into the silicon substrate 51 with the resist film 52 as a mask as illustrated in FIG. 5B to form an ion injected layer 55. The ion injection is performed by using As as a dopant with 2×10$^{15}$ cm$^{-2}$ in dosage and 50 keV in acceleration voltage.

Then, the wafer retainer 61 of FIG. 4 with a multiplicity of wafers, 101a–101n mounted thereon was placed in the chamber 31 and mounted on the loading base 35 which is provided with the built-in heater 34. In this case, the heater 34 is not put to use and the wafers 101a–101n are kept at room temperature.

Subsequently, the gas of chlorosulfonic acid [SO$_2$Cl(OH)] is introduced into the chamber 31. After this introduction is continued for about 30 minutes, it is stopped and the substrate retainer 61 is extracted from the interior of the chamber 31.

The substrate retainer 61 is washed with water and dried. While the washing with water is proceeding, the resist film 52a which has survived the solution is peeled from the silicon substrate 51 and removed as illustrated in FIG. 5C.

Next, the silicon substrate 51 is placed in a heat-treating oven and annealed therein, with the result that the As in the ion injected layer 55 will be activated and an n-type diffused layer 55a.

Thereafter, the silicon substrate 51 in the ensuant state is passed through necessary steps to manufacture a semiconductor integrated circuit device such as the LSI.

In the eighth embodiment of this invention, even when the resist film 52 contains As therein, this resist film 52 can be easily removed from the silicon substrate 52 with the gas of chlorosulfonic acid [SO$_2$Cl(OH)] as described above.

Further, since this embodiment uses the chlorosulfonic acid in the gaseous state, it allows the acid to be handled with ease and permits the etchant used for the removal of the resist film to be controlled easily by the adjustment of the flow volume of the gas. Further, this embodiment enables a multiplicity of substrates to be treated all at once and contributes to improve the efficiency of quantity production of the semiconductor devices.

Though the resist films are utilized as masks for ion injections in the embodiments described above, they may be otherwise utilized as masks for dry etching. In this case, the metals (Al and Ti, for example) as the materials for a wire are suffered to mingle with the resist film.

As described above, this invention exposes the resist film to chlorosulfonic acid [SO$_2$Cl (OH)] in the liquid state or in the gaseous state.

By using the liquid chlorosulfonic acid [SO$_2$Cl(OH)] particularly at a temperature of not lower than 70° C., therefore, the resist film can be easily removed from the substrate even when the resist film incorporates therein any of As, P, and B.

By using the gaseous chlorosulfonic acid [SO$_2$Cl(OH)] particularly at a temperature of not higher than 60° C., therefore, the resist film can be easily removed from the substrate even when the resist film incorporates therein any of As, P, and B.

What is claimed is:

1. A method for the removal of a resist film, in the form of a used mask, on a substrate, said method comprising contacting said resist film on said substrate with chlorosulfonic acid thereby causing said resist film to react with said acid and effecting removal of said resist film from said substrate.

2. A method according to claim 1, wherein said chlorosulfonic acid is in gaseous form and is reacted with said resist film at a temperature not higher than 60° C.

3. A method according to claim 1, wherein said chlorosulfonic acid is in liquid form and is reacted with said resist film at a temperature of at least 70° C.

4. A method according to claim 1, wherein said resist film contains an inorganic element.

5. A method according to claim 4, wherein said inorganic element is one selected from the group consisting of arsenic, phosphorus, boron, aluminum, and titanium.

6. A method for the production of a semiconductor device, said method comprising: contacting a resist film on a substrate with chlorosulfonic acid thereby causing said resist film to react with said acid and effecting removal of said resist film from said substrate.

7. A method according to claim 6, wherein said chlorosulfonic acid is in gaseous form and is reacted with said resist film at a temperature not higher than 60° C.

8. A method according to claim 6 further comprising, prior to said contacting:

forming the resist film on the substrate;

forming at least one hole in said resist film to produce a mask; and subjecting said substrate to ion injection through said mask.

9. A method according to claim 6, wherein said chlorosulfonic acid is in liquid form and is reacted with said resist film at a temperature of at least 70° C.

10. A method for the removal of a resist film formed on a substrate, said method comprising contacting said resist film on said substrate with a gas containing sulfuric anhydride and hydrochloric acid thereby causing said resist film to react with said gas and effecting removal of said resist film from said substrate.

11. A method according to claim 10, wherein said resist film contains an inorganic element.

12. A method according to claim 11, wherein said inorganic element is one selected from the group consisting of arsenic, phosphorus, boron, aluminum, and titanium.

13. A method for the production of a semiconductor device, comprising contacting a resist film, in the form of a used mask, on a substrate, with a gas containing sulfuric anhydride and hydrochloric acid thereby causing said resist film to react with said gas and effecting removal of said resist film from said substrate.

* * * * *